United States Patent

Yokogawa

[11] Patent Number: 4,787,078
[45] Date of Patent: Nov. 22, 1988

[54] OPTICAL DATA RECORDING AND REPRODUCING SYSTEM WITH CONTROL OF HIGH FREQUENCY SUPERPOSED SIGNAL APPLIED TO SEMICONDUCTOR LASER

[75] Inventor: Fumihiko Yokogawa, Saitama, Japan

[73] Assignee: Pioneer Electronic Corporation, Tokyo, Japan

[21] Appl. No.: 26,704

[22] Filed: Mar. 17, 1987

[30] Foreign Application Priority Data

Mar. 17, 1986 [JP] Japan .............................. 61-38764[U]

[51] Int. Cl.$^4$ ........................................... G11B 7/125
[52] U.S. Cl. .................... 369/122; 369/116; 369/124
[58] Field of Search ............... 369/122, 121, 116, 112, 369/124; 372/32, 29, 38, 46, 52, 31; 350/162.12, 358; 346/762

[56] References Cited

U.S. PATENT DOCUMENTS

| | | |
|---|---|---|
| 3,866,238 | 2/1975 | Monroe . |
| 4,283,785 | 8/1981 | Miyauchi et al. ................ 369/121 |
| 4,480,325 | 10/1984 | Aiki et al. . |
| 4,507,767 | 3/1985 | Taksugi .............................. 369/122 |
| 4,656,618 | 4/1987 | Kaku et al. ........................ 369/112 |
| 4,701,609 | 10/1987 | Koishi et al. ...................... 369/116 |
| 4,712,218 | 12/1987 | Ohnuki et al. ...................... 372/31 |

FOREIGN PATENT DOCUMENTS 0082357 6/1983 European Pat. Off. .
3429255 2/1985 Fed. Rep. of Germany .

Primary Examiner—Donald McElheny, Jr.
Attorney, Agent, or Firm—Sughrue, Mion, Zinn, Macpeak, and Seas

[57] ABSTRACT

In an optical data recording and reproducing system in which recording and reproducing data are carried out with a semiconductor laser, circuitry is provided to reduce the level of a high frequency current to be superposed on the laser during a data recording operation relative to the level during a data reproducing operation, to provide laser output only when necessary, to prolong laser life.

4 Claims, 2 Drawing Sheets

OPTICAL DATA RECORDING AND REPRODUCING SYSTEM WITH CONTROL OF HIGH FREQUENCY SUPERPOSED SIGNAL APPLIED TO SEMICONDUCTOR LASER

BACKGROUND OF THE INVENTION

1. Field of the Invention

This invention relates to an optical data recording and reproducing system using a semiconductor laser.

2. Background of the Invention

FIG. 1 shows a conventional drive circuit for a semiconductor laser (LD) in which a high frequency superposition technique is employed. FIG. 1 shows a high frequency oscillator 1 of several tens of megahertz (MHz) to several hundreds of megahertz. An automatic power control (APC) circuit 2 receives the detection signal of a monitor diode (MD) 5 adapted to detect the power of the laser beam emitted by the laser 4, to thereby make the power of the laser beam constant. The output currents of the high frequency oscillator 1 and the automatic power control circuit 2 are combined and applied through an LC circuit 3 to the semiconductor laser 4. The LC circuit 3 permits the application of the higher frequency signal to the semiconductor laser 4, but prevents the application of the high frequency signal to the automatic power control circuit 2.

Heretofore, by superposing a high frequency current as shown in FIG. 1, the laser is oscillated in a multi-mode or it is oscillated intermittently so that the oscillation of the laser is suspended when the laser beam is reflected back to the laser, whereby increase of laser noise is prevented.

FIG. 2 is a block diagram showing the APC circuit 2 shown in FIG. 1. A switching circuit in the APC circuit 2 is switched on or off by write data, which is input data processed by digital modulation, so that a constant current is added to change a light power from a low level to a high level, thereby producing pits.

The APC circuit controls the output power of the laser 4 which varies depending on the temperature. The auto power control of the APC circuit is carried out by comparing an output of a built-in monitor diode of the laser 4 with an objective value.

The write data $M^2$ modulated at sync Ass'y modulator unit (not shown) is once latched by a write clock and transmitted to a laser power control unit. When the data is written, a large laser power is required. The large power is obtained by adding the constant current switched by the write data to a current at the reading time previous to the writing to operate the laser. When a disc has a constant angular velocity, linear velocities at inner and outer radial locations are different from each other. Optimum write power increases at an outer circumferential portion and, thus the value of a switching current is varied in proportion to a value of 4 bits of radial location data received from a drive CPU so as to change the power.

When the data is written, servo control is not carried out by the built-in monitor diode, since the inclination of operational characteristics (differential quantum efficiency) hardly changes even if the temperature changes. In practical use, since the retained power at reading time changes due to the drift of the monitor diode and the differential quantum efficiency also changes slightly due to the temperature, the temperature compensation of the added current is carried out.

Usually, a slow starter circuit having a large time constant is used to prevent an abrupt current from flowing at the ON time of the laser power. Mechanically, an inter lock switch is used so that if a disc cartridge is not completely set to a spindle motor, an electric power is not applied to the laser power control circuit.

FIG. 3 shows the laser beam power provided when the high frequency current is superposed. As is apparent from FIG. 3, in the case when the superposing high frequency current is increased, the peak value of the laser beam power is much higher than its average value during the recording operation. The optical disk responds to the average laser beam power but the degree of deterioration of the semiconductor laser LD is determined from the peak value of the recording laser beam power. Therefore, if deterioration of the semiconductor is sought to be minimized, then the average value of the laser beam power cannot be increased when the recording operation is carried out with the high frequency current being superposed. On the other hand, if the average value of the laser beam power is sought to be maximized, then the deterioration of the semiconductor laser is accelerated.

SUMMARY OF THE INVENTION

Accordingly, an object of this invention is to eliminate the above-described difficulty accompanying a conventional drive circuit for a semiconductor laser in which a high frequency superposing technique is employed.

The foregoing object and other objects of the invention have been achieved by the provision of an optical data recording and reproducing system in which a semiconductor laser is used to record data on an optical recording medium or reproduce data therefrom. According to the invention, the optical data recording and reproducing system comprises level varying means for varying the level of a high frequency current superposed on the semiconductor laser separately for a data recording operation and for a data reproducing operation.

This invention has been developed based on the fact that, when optical power is used to cause a semiconductor laser to emit a laser beam, the noise attributed to the returned laser beam is minimized. Therefore, in the system of the invention, in the data recording operation, the superposing high frequency current is interrupted, and the recording power is increased.

The nature, principle and utility of the invention will become more apparent from the following detailed description when read in conjunction with the accompanying drawings.

DETAILED DESCRIPTION OF THE PREFERRED EMBODIMENTS

Figure 1:
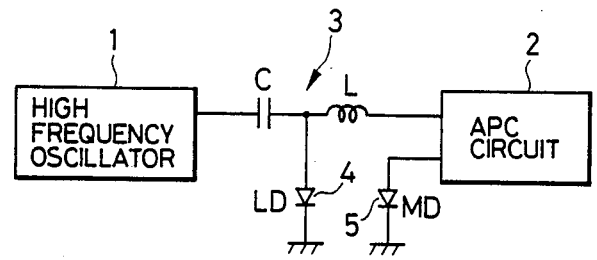
FIG. 1 is a circuit diagram, partly as a block diagram, showing a conventional drive circuit for a semiconductor laser in which a high frequency superposition technique is employed.
Figure 2:
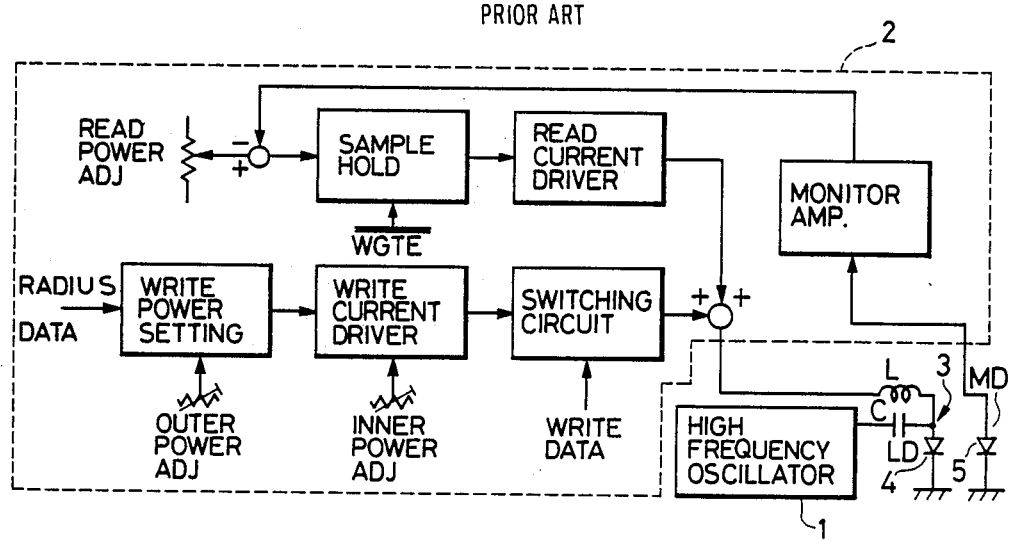
FIG. 2 is a circuit diagram showing an APC circuit in FIG. 1.

One example of an optical data recording and reproducing system according to this invention will be described with reference to FIG. 4, in which those circuit elements which have been already described with reference to FIG. 1 are therefore designated by the same reference numerals or characters.

Figure 4:
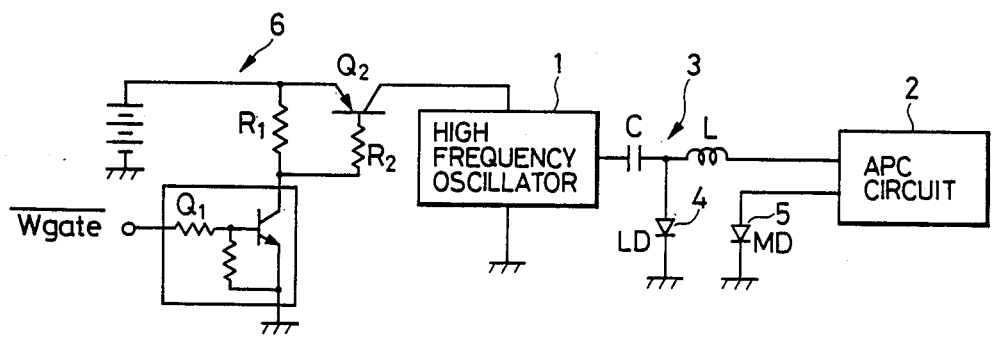
FIG. 4 is a circuit diagram, partly as a block diagram, showing one example of an optical data recording and reproducing system according to the invention.
Figure 3:
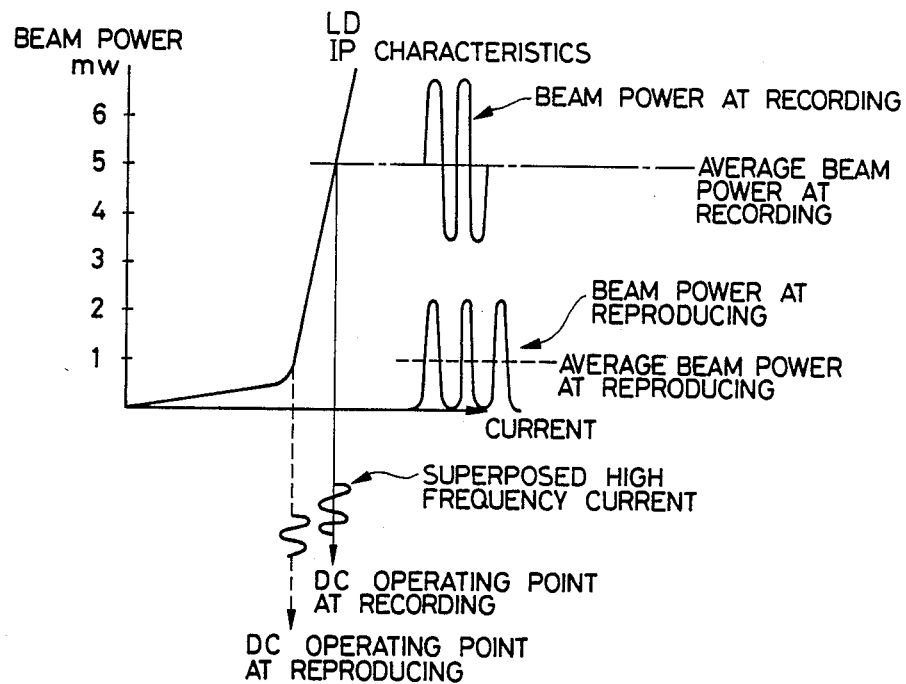
FIG. 3 is a graphical representation indicating optical powers provided when a high frequency current is superposed on a semiconductor laser.

As is apparent from comparison between FIGS. 1 and 4, the circuit of FIG. 4 can be obtained by adding a power switching circuit 6 comprising transistors $Q_1$ and $Q_2$ and resistors $R_1$ and $R_2$ to the circuit shown in FIG. 1. In the circuit of FIG. 4, a control signal $-W_{gate}$ is raised to a high level to render the transistor $Q_2$ conductive (on), so that the power source is electrically connected to the high frequency oscillator 1.

Figure 5:
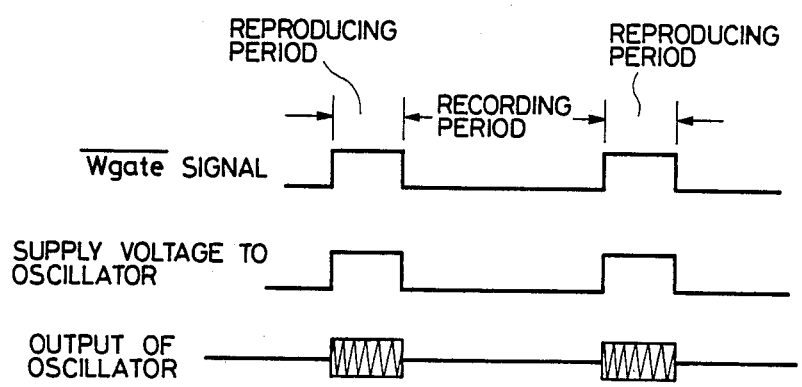
FIG. 5 is a timing chart for a description of the response of an oscillator to the on-off operation of a power source in the system according to the invention.

FIG. 5 shows how the oscillator responds to the on-off operation of the power source. As is apparent from FIG. 5, according to the control signal $-W_{gate}$ the supply voltage is intermittently applied to the high frequency oscillator 1 so that the oscillator 1 intermittently provides its output. Thus, in this system, the on-off operation of the oscillator 1 can be controlled with a delay time of several microseconds ($\mu$s) from the application of the control signal.

In the optical data recording and reproducing system of the invention, the superposing high frequency signal can be cut off during the recording operation, which eliminates the difficulty that the peak oscillation level of the semiconductor laser becomes higher than the recording power required for data on the disk. Therefore, the recording power provided by the semiconductor laser can be greater than in the case where the high frequency signal is superposed.

In the above-described system, the power source of the oscillator is switched on and off. However, the same effect can be obtained by alternately muting or attenuating the output of the oscillator.

Thus, according to the invention, the quick deterioration of the laser can be prevented while the recording power provided by the laser can be made greater than in the case where the high frequency signal is superposed.

What is claimed is:

1. An optical data recording and reproducing system, comprising:
    a semiconductor laser for irradiating an optical recording disk;
    means for applying a DC or low frequency current to said laser at a low amplitude during a data reproducing operation and a high amplitude during a data recording operation of said recording disk;
    means for superposing a high frequency current on said laser; and
    level varying means, connected to said superposing means, for varying a level of said high frequency current so as to provide a first level of said high frequency current during said data recording operation and a second, higher level of said high frequency current during said data reproducing operation.

2. An optical system as recited in claim 1, wherein said level varying means enables said superposing means during said data reproducing operation and inhibits said superposing means during said data recording operation.

3. An optical system as recited in claim 1, wherein said high frequency current has a frequency in a range about 10 MHz and below 1000 MHz.

4. An optical system as recited in claim 1, wherein said level varying means attenuates said superposing means during said data recording operation.

* * * * *